United States Patent
Gahagan et al.

(10) Patent No.: US 10,838,255 B2
(45) Date of Patent: Nov. 17, 2020

(54) DIRECT VIEW DISPLAY DEVICE AND LIGHT UNIT FOR DIRECT VIEW DISPLAY DEVICE

(71) Applicant: CORNING INCORPORATED, Corning, NY (US)

(72) Inventors: Kevin Thomas Gahagan, Painted Post, NY (US); Jacques Gollier, Redmond, WA (US); Dmitri Vladislavovich Kuksenkov, Elmira, NY (US)

(73) Assignee: Corning Incorporated, Corning, NY (US)

( * ) Notice: Subject to any disclaimer, the term of this patent is extended or adjusted under 35 U.S.C. 154(b) by 512 days.

(21) Appl. No.: 15/516,787

(22) PCT Filed: Oct. 7, 2015

(86) PCT No.: PCT/US2015/054344
§ 371 (c)(1),
(2) Date: Apr. 4, 2017

(87) PCT Pub. No.: WO2016/057588
PCT Pub. Date: Apr. 14, 2016

(65) Prior Publication Data
US 2018/0267362 A1    Sep. 20, 2018

Related U.S. Application Data

(60) Provisional application No. 62/060,934, filed on Oct. 7, 2014, provisional application No. 62/100,349, filed on Jan. 6, 2015.

(51) Int. Cl.
*G09F 13/04* (2006.01)
*G02F 1/13357* (2006.01)
(Continued)

(52) U.S. Cl.
CPC ..... *G02F 1/133606* (2013.01); *G02B 3/0031* (2013.01); *G02B 3/0068* (2013.01);
(Continued)

(58) Field of Classification Search
CPC ......... G02F 1/133606; G02F 1/133611; G02F 1/133526; G02F 1/133512;
(Continued)

(56) References Cited

U.S. PATENT DOCUMENTS 5,598,281 A    1/1997   Zimmerman et al.
6,410,213 B1   6/2002   Raguin et al.
(Continued)

FOREIGN PATENT DOCUMENTS

| JP | 01189685 A * | 7/1989 |
| JP | 2004184612 A | 7/2004 |
| WO | 2001014927 A1 | 3/2001 |

OTHER PUBLICATIONS

Espacenet English translation of reference JP-01189685-A (Year: 1989).*
(Continued)

*Primary Examiner* — William J Carter
*Assistant Examiner* — Omar Rojas Cadima
(74) *Attorney, Agent, or Firm* — Michael A. Hood; Jeffrey A. Schmidt

(57) ABSTRACT

A direct view display device includes a light unit, a collimating unit, an image display unit, and a contrast enhancement unit. The contrast enhancement unit includes opposing first and second major surfaces. The first major surface includes an array of optical elements. The second major surface includes a light absorbing layer and an array of apertures in the light absorbing layer and corresponding to the array of optical elements. The optical elements are disposed between the light unit and the light absorbing layer.

(Continued)

The collimating unit is disposed between the light unit and the contrast enhancement unit. The image display unit is disposed between the collimating unit and the contrast enhancement unit. The contrast enhancement unit and the image display unit are arranged such that each optical element of the contrast enhancement unit is aligned with at least one corresponding pixel of the image display unit.

24 Claims, 6 Drawing Sheets

(51) Int. Cl.
  *G02B 3/00* (2006.01)
  *G02F 1/1335* (2006.01)
  *H01L 51/52* (2006.01)
  *F21V 8/00* (2006.01)

(52) U.S. Cl.
  CPC .. *G02F 1/133504* (2013.01); *G02F 1/133512* (2013.01); *G02F 1/133526* (2013.01); *G02F 1/133611* (2013.01); G02B 6/0053 (2013.01); G02B 6/0055 (2013.01); G02F 1/133502 (2013.01); G02F 1/133603 (2013.01); G02F 1/133605 (2013.01); G02F 2001/133507 (2013.01); G02F 2001/133562 (2013.01); G02F 2001/133607 (2013.01); *H01L 51/5275* (2013.01)

(58) Field of Classification Search
  CPC ... G02F 1/133504; G02F 2001/133507; G02F 2001/133607; G02F 2001/133562; G02F 1/133605; G02F 1/133603; G02F 1/133502; G02F 2001/133567; G02F 1/133305; G02B 3/0068; G02B 3/0031; G02B 6/0053; G02B 6/0055; H01L 51/5275
  USPC .................................. 362/617, 621, 627, 97.4
  See application file for complete search history.

(56) References Cited

U.S. PATENT DOCUMENTS

| | | | |
|---|---|---|---|
| 6,466,372 B1 | 10/2002 | Morris et al. | |
| 6,466,737 B1 | 10/2002 | Morris et al. | |
| 6,474,827 B2 | 11/2002 | Shinohara et al. | |
| 6,606,135 B2 | 8/2003 | Nakanishi et al. | |
| 6,620,576 B2 | 9/2003 | Raguin | |
| 6,700,702 B2 | 3/2004 | Sales | |
| 6,770,425 B2 | 8/2004 | Brady et al. | |
| 6,829,087 B2 * | 12/2004 | Freese | B29C 43/021 |
| | | | 359/455 |
| 6,835,535 B2 | 12/2004 | Gretton et al. | |
| 6,871,982 B2 * | 3/2005 | Holman | G02B 5/045 |
| | | | 257/E33.072 |
| 6,967,779 B2 | 11/2005 | Fadel et al. | |
| 6,970,289 B1 | 11/2005 | Auerbach et al. | |
| 7,033,736 B2 | 4/2006 | Morris et al. | |
| 7,187,495 B2 * | 3/2007 | Shimizu | G02B 3/0025 |
| | | | 359/453 |
| 7,198,373 B2 | 3/2007 | Silverstein et al. | |
| 7,229,199 B2 | 6/2007 | Lee et al. | |
| 7,295,262 B2 | 12/2007 | Mi et al. | |
| 7,334,897 B2 | 2/2008 | Silverstein et al. | |
| 7,400,380 B2 | 7/2008 | Hahn | |
| 7,480,098 B2 | 1/2009 | Oh et al. | |
| 7,502,169 B2 | 3/2009 | Wood | |
| 7,808,581 B2 | 10/2010 | Panagotacos et al. | |
| 7,940,341 B2 | 5/2011 | Bierhuizen et al. | |
| 8,408,775 B1 * | 4/2013 | Coleman | F21V 7/04 |
| | | | 362/602 |
| 8,558,966 B2 | 10/2013 | Kim et al. | |
| 8,842,064 B2 * | 9/2014 | Robinson | G09G 3/3413 |
| | | | 345/102 |
| 8,950,883 B2 | 2/2015 | Entienne et al. | |
| 2001/0005243 A1 * | 6/2001 | Yamaguchi | G02F 1/133602 |
| | | | 349/61 |
| 2001/0012078 A1 * | 8/2001 | Hira | G02B 3/0075 |
| | | | 349/95 |
| 2006/0044523 A1 * | 3/2006 | Teijido | G02B 6/0011 |
| | | | 353/53 |
| 2006/0193578 A1 * | 8/2006 | Ouderkirk | B29C 48/08 |
| | | | 385/115 |
| 2006/0204744 A1 | 9/2006 | Hiraishi et al. | |
| 2007/0247684 A2 | 10/2007 | Wood | |
| 2008/0117359 A1 * | 5/2008 | Yoon | G02F 1/133604 |
| | | | 349/64 |
| 2010/0039797 A1 | 2/2010 | Shinkai et al. | |
| 2011/0058389 A1 | 3/2011 | Shiau et al. | |
| 2012/0033441 A1 | 2/2012 | Sousek et al. | |
| 2013/0033849 A1 | 2/2013 | Roberts et al. | |
| 2013/0127689 A1 | 5/2013 | Gollier | |
| 2013/0235561 A1 | 9/2013 | Etienne et al. | |

OTHER PUBLICATIONS

3M Optical Systems; Vikuiti™ Dual Brightness Enhancement Film II (DBEF II); 2010; 3m.com/Displayfilms; 4 Pages.
Yating Gao, Zhenyue Luo, Ruidong Zhu, Qi Hong, Shin-Tson Wu, Fellow, IEEE, Ming-Chun Li, Seok-Lyul Lee, and Wen-Ching Tsai, A "High Performance Single-Domain LCD With Wide Luminance Distribution." Journal of Display Technology, vol. 11, No. 4, Apr. 2015, pp. 1-10.
Yating Gao, Zhenyue Luo* Ruidong Zhu, Qi Hong* Shin-Tson Wu*, Ming-Chun Li*, Seok-Lyul Lee Wen-Ching Tsai, "An LCD with OLED-like Luminance Distribution." College of Optics and Photonics,University of Central Florida,SID 2015 Digest, pp. 1-4.
International Search Report and Written Opinion of the International Searching Authority; PCTUS15/054344; dated Aug. 19, 2016; 23 Pages; European Patent Office.
TW104133066 Office Action and Search Report dated Jun. 26, 2019, Taiwan Patent Office, 3 Pgs.
Japanese Patent Application Np. 2017518539; English Translation of the Office Action dated Jul. 10, 2019, Japan Patent Office; 6 Pgs.
English Translation of CN201580066407.7 Office Action dated Mar. 26, 2020; 17 Pages; Chinese Patent Office.

* cited by examiner

DIRECT VIEW DISPLAY DEVICE AND LIGHT UNIT FOR DIRECT VIEW DISPLAY DEVICE

This application claims the benefit of priority to International Application Number PCT/US2015/054344, filed Oct. 7, 2015, which claims the benefit of priority to U.S. Provisional Application Nos. 62/060,934, filed Oct. 7, 2014, and 62/100,349, filed Jan. 6, 2015, the content of each of which is incorporated herein by reference in its entirety.

BACKGROUND

1. Field

This disclosure relates to display devices, and more particularly to direct view display devices configured to generate images with high brightness and high contrast ratio.

2. Technical Background

A conventional liquid crystal display (LCD) device generally includes a light source, a LCD panel, and a diffusing sheet disposed between the light source and the LCD panel. Light emitted by the light source passes through the LCD panel to generate an image that can be viewed by a viewer. The diffusing sheet diffuses the light emitted by the light source to aid in illuminating the LCD panel evenly over an entire surface of the LCD panel. The LCD device generally has an output brightness or luminance of about 400 cd/m$^2$.

SUMMARY

Disclosed herein are display devices and light units for direct view display devices.

Disclosed herein is one exemplary direct view display device comprising a light unit, a collimating unit, an image display unit, and a contrast enhancement unit. The contrast enhancement unit comprises a first major surface and a second major surface opposite the first major surface. The first major surface comprises an array of optical elements. The second major surface comprises a light absorbing layer and an array of apertures in the light absorbing layer and corresponding to the array of optical elements. The contrast enhancement unit and the light unit are arranged such that the array of optical elements is disposed between the light unit and the light absorbing layer. The collimating unit is disposed between the light unit and the contrast enhancement unit. The image display unit is disposed between the collimating unit and the contrast enhancement unit and comprises an array of pixels. The contrast enhancement unit and the image display unit are arranged such that each optical element of the contrast enhancement unit is aligned with at least one corresponding pixel of the image display unit.

Also disclosed herein is one exemplary light unit for a direct view display device. The light unit comprises a series of light sources, a collimating unit, and a diffusing unit. The series of light sources is arranged in a row and configured to emit light. The collimating unit is disposed adjacent to the series of light sources to collimate the light in a second direction perpendicular to the row without substantially collimating the light in a first direction parallel to the row. The diffusing unit is disposed adjacent to the series of light sources to diffuse the light in the first direction parallel to the row without substantially diffusing the light in the second direction perpendicular to the row.

Also disclosed herein is another exemplary light unit for a direct view display device. The light unit comprises a light source, a conditioning element, and a collimating element. The light source is configured to emit wide-angle light having a substantially Lambertian angular intensity distribution. The conditioning element is disposed adjacent to the light source to transform the wide-angle light into uniform light having a substantially uniform angular intensity distribution at a reference plane spaced from the conditioning element. The collimating element is disposed adjacent to the conditioning element to collimate the uniform light in at least one direction.

Also disclosed herein is another exemplary light unit for a direct view display device. The light unit comprises a light emitting unit configured to emit light and a collimating unit disposed adjacent to the light emitting unit to collimate the light in a second direction without substantially collimating the light in a first direction perpendicular to the second direction.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
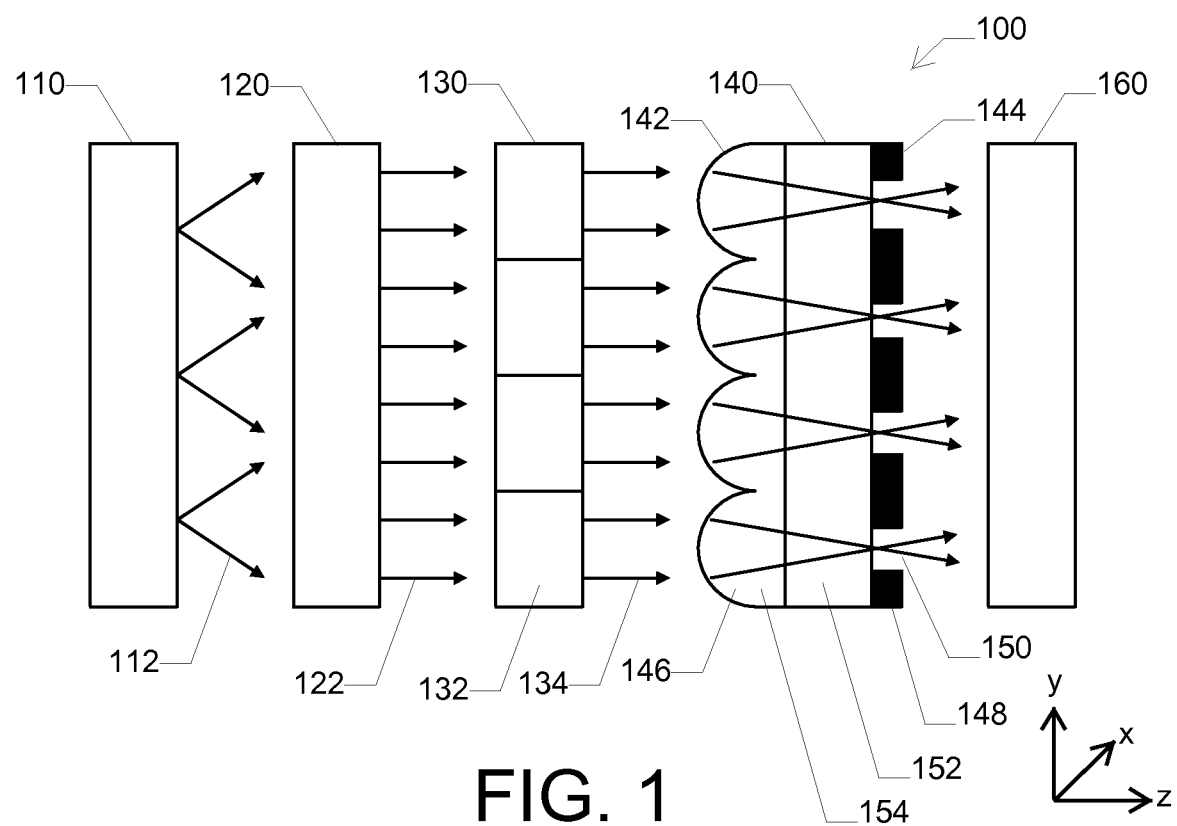
FIG. 1 is a schematic view of one exemplary embodiment of a display device.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

In various embodiments, a light unit for a direct view display device comprises a series of light sources, a collimating unit, and a diffusing unit. The series of light sources is arranged in a row and configured to emit light. The collimating unit is disposed adjacent to the series of light sources to collimate the light in a first direction substantially perpendicular to the row without collimating the light in a second direction substantially parallel to the row. The diffusing unit is disposed adjacent to the series of light sources to diffuse the light in the second direction substantially parallel to the row without diffusing the light in the first direction substantially perpendicular to the row.

In various embodiments, a display device comprises a light unit, an image display unit, and a contrast enhancement unit. The light unit comprises a light emitting unit and a collimating unit. In some embodiments, the light unit comprises a diffusing unit. The contrast enhancement unit comprises a first major surface and a second major surface opposite the first major surface. The first major surface of the contrast enhancement unit comprises an array of optical elements. The second major surface of the contrast enhancement unit comprises a light absorbing layer and an array of apertures in the light absorbing layer. The array of apertures corresponds to the array of optical elements. In some embodiments, the contrast enhancement unit comprises a diffusing element (e.g., between the array of optical elements and the light absorbing layer and/or within the apertures in the light absorbing layer). The contrast enhancement unit and the light unit are arranged such that the array of optical elements is disposed between the light unit and the light absorbing layer. The collimating unit is disposed between the light unit and the contrast enhancement unit. In some embodiments, the display device comprises an image display unit disposed between the collimating unit and the contrast enhancement unit. The image display unit comprises an array of pixels. In some embodiments, the contrast enhancement unit and the image display unit are arranged such that each optical element of the contrast enhancement unit is aligned with at least one corresponding pixel of the image display unit.

FIG. 1 is a schematic view of one exemplary embodiment of a display device 100. In some embodiments, display device 100 comprises a direct view display device configured to generate an image that is viewable directly by a user without being projected onto a screen. Display device 100 comprises a light unit comprising a light emitting unit 110 and a collimating unit 120. Display device 100 comprises an image display unit 130 and a contrast enhancement unit 140. It will be understood that adjacent components of display device 100 can be adhered to each other (e.g., by an optically clear adhesive), secured within a bezel or frame (with or without an air gap therebetween), or coupled by another suitable coupling mechanism.

Light emitting unit 110 comprises one or more light sources each configured to emit light. For example, the light source comprises a light emitting diode (LED), an organic light emitting diode (OLED), a halogen light, an incandescent light, or another suitable light source. In some embodiments, light emitting unit 110 comprises a plurality of LEDs arranged in a 2-dimensional (2D) array. In another embodiment, light emitting unit 110 comprises a light bar adjacent to a light guiding sheet and comprising a row (e.g., a 1-dimensional array) of LEDs. The light bar emits light into an edge of the light guiding sheet, and the light guiding sheet disperses and emits the light from a surface of the light guiding sheet. In some embodiments, light emitting unit 110 emits non-collimated light 112. In some embodiments, light emitting unit 110 is positioned such that light emitted from the light emitting unit passes through image display unit 130 to form a viewable image as described herein. Thus, light emitting unit 110 is configured as a backlight unit.

Collimating unit 120 is positioned adjacent to light emitting unit 110 such that light emitted from the light emitting unit is incident on the collimating unit. Collimating unit 120 is configured to collimate the light emitted by light emitting unit 110. For example, non-collimated light 112 emitted from light emitting unit 110 passes through collimating unit 120 to form collimated light 122. Collimating unit 120 comprises a cylindrical lens, a Fresnel lens, or another suitable collimating device. For example, in some embodiments, collimating unit 120 comprises an array of Fresnel lenses.

Although collimating unit 120 is shown in FIG. 1 as being separate from light emitting unit 110, other embodiments are included in this disclosure. In some embodiments, the collimating unit is integral with the light emitting unit. For example, an output surface of the light emitting unit comprises an integral collimating unit. Thus, the light unit is configured as a collimated light unit.

Image display unit 130 is positioned adjacent to collimating unit 120 such that collimated light 122 emitted from the collimating unit is incident on the image display unit. Image display unit 130 comprises an array of display pixels 132. For example, the array of display pixels 132 comprises a 2D array having suitable x and y dimensions (e.g., width and length) to display an image of a desired size. Each display pixel 132 comprises a light valve configured to control the passage of light therethrough. For example image display unit 120 comprises an LCD panel, and the array of display pixels 132 comprises an array of LCD cells. Each LCD cell is configured to open and close to control the passage of light therethrough. In some embodiments, each display pixel 132 is divided into a plurality of sub-pixels each associated with a dedicated display color component (e.g., red, green, or blue). Color images can be generated by using adjacent red, green, and blue sub-pixels. In some embodiments, collimated light 122 passes through a display pixel 132 of image display unit 130 to form an image pixel 134. For example, collimated light 122 passes through a plurality of display pixels 132 of image display unit 130 to form a plurality of image pixels 134 that cooperatively generate a viewable image. In some embodiments, image display unit 130 comprises one or more polarizing layers (e.g., input and output polarizers).

Collimating the light emitted by light emitting unit 110 prior to passing the light through image display unit 120 (e.g., by positioning collimating unit 120 between the light emitting unit and the image display unit) can aid in increasing the intensity or brightness of the viewable image relative to a conventional display device. Thus, in some embodiments, display device 100 comprises an output brightness or luminance of at least about 500 cd/m$^2$, at least about 600 cd/m$^2$, at least about 700 cd/m$^2$, at least about 800 cd/m$^2$, at least about 900 cd/m$^2$, at least about 1000 cd/m$^2$, at least about 1100 cd/m$^2$, at least about 1200 cd/m$^2$, at least about 1300 cd/m$^2$, at least about 1400 cd/m$^2$, or at least about 1500 cd/m$^2$.

Contrast enhancement unit 140 is positioned adjacent to image display unit 130 such that light that is emitted from the image display unit is incident on the contrast enhancement unit. In some embodiments, contrast enhancement unit 140 is configured as a contrast enhancement sheet. The contrast enhancement sheet can be substantially flat or planar. Alternatively, the contrast enhancement sheet can be non-planar. For example, the contrast enhancement sheet can be curved, rolled (e.g., into a tube), bent (e.g., at one or more edges), or formed into another non-planar configuration. Contrast enhancement unit 140 comprises a first major surface 142 and a second major surface 144 opposite the first major surface. First major surface 142 comprises an array of optical elements 146. Second major surface 142 comprises a light absorbing layer 148 and an array of apertures 150 in the light absorbing layer. The array of apertures 150 corresponds to the array of optical elements 146. For example, each optical element 146 is aligned with at least one aperture 150.

Figure 2:
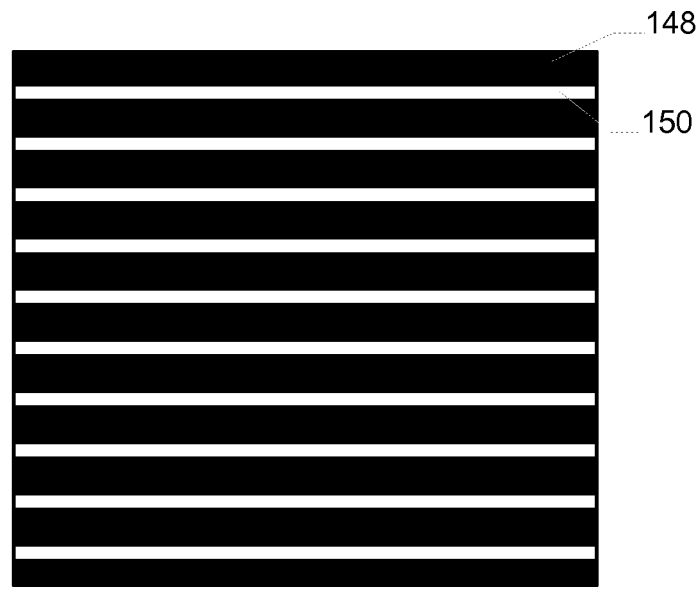
FIG. 2 is a front view of one exemplary embodiment of a light absorbing layer.
Figure 3:
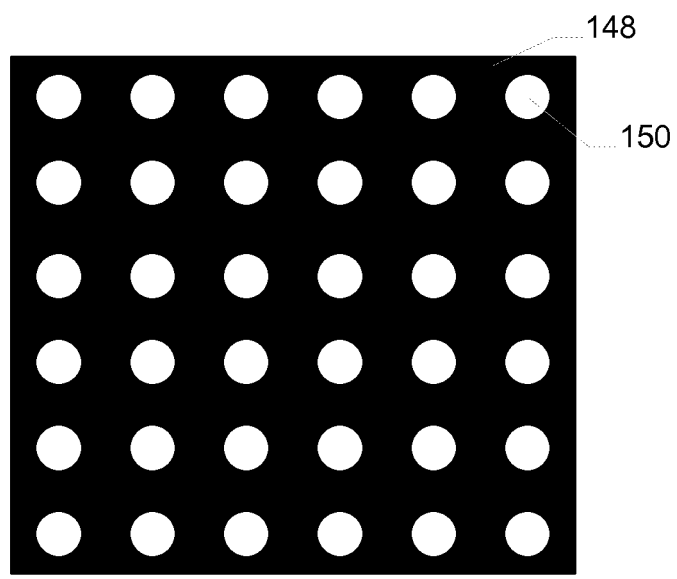
FIG. 3 is a front view of another exemplary embodiment of a light absorbing layer.

In some embodiments, optical elements 146 comprise microlenses as shown in FIG. 1. The microlenses are configured as lenticular lenses, spherical lenses, aspherical lenses, another suitable lens shape, or combinations thereof. For example, in some embodiments, the microlenses are configured as lenticular lenses extending at least partially across a width and/or a length of the contrast enhancement unit. In other embodiments, the microlenses are configured as spherical lenses dispersed about the width and/or length of the contrast enhancement unit (e.g., in a 2-dimensional array). Additionally, or alternatively, apertures 150 have a circular shape, a rectangular shape, another suitable shape, or combinations thereof. For example, FIG. 2 is a front view of one exemplary embodiment of light absorbing layer 148 with elongate rectangular apertures 150 formed therein. The apertures have an elongate rectangular shape extending at least partially across a width and/or a length of the contrast enhancement unit. Thus, the elongate apertures can be aligned with lenticular microlenses. FIG. 3 is a front view of another exemplary embodiment of light absorbing layer 148 with circular apertures 150 formed therein. The apertures have a circular shape and are dispersed about the width and/or length of the contrast enhancement unit. Thus, the circular apertures can be aligned with spherical microlenses. In various embodiments, the shape and/or placement of the apertures corresponds to the configuration and/or placement of the microlenses.

Although optical elements 146 of the embodiment shown in FIG. 1 are described as comprising microlenses, other embodiments are included in this disclosure. In some embodiments, the optical elements comprise mirrors. For example, one or more of the mirrors is configured as a parabolic reflector cavity with the mouth of the cavity (e.g., the wider end) facing the image display unit and an opening formed through the parabolic reflector cavity opposite the mouth (e.g., in the narrow end) and aligned with the corresponding aperture of the light absorbing layer.

Contrast enhancement unit 140 and light unit 110 are arranged such that the array of optical elements 146 is disposed between the light unit and light absorbing layer 148. Thus, first major surface 142 comprises an input surface of contrast enhancement unit 140, and second major surface 144 comprises an output surface of the contrast enhancement unit. Light that passes through image display unit 130 enters contrast enhancement unit 140 through first major surface 142 and exits the contrast enhancement unit through second major surface 144 to transmit the viewable image for viewing by a viewer. In some embodiments, image display unit 130 and contrast enhancement unit 140 are arranged such that an optical element 146 focuses an image pixel 134 on a corresponding aperture 150 of the contrast enhancement unit. For example, the plurality of image pixels 134 transmitted by image display unit 130 is focused by the array of optical elements 146 on the array of apertures 150 so that the image pixels pass through the apertures in the light absorbing layer to transmit the viewable image through light absorbing layer 148 for viewing by the viewer.

In some embodiments, contrast enhancement unit 140 and image display unit 130 are arranged such that each optical element 146 of the contrast enhancement unit is aligned with at least one corresponding pixel of the image display unit. For example, the number of optical elements 146 in the array of optical elements can be the same as the number of pixels in the array of pixels, and the array of optical elements can have the same pitch as the array of pixels in two dimensions such that each optical element is aligned with one corresponding pixel and each pixel is aligned with one corresponding optical element. Alternatively, the number of optical elements 146 in the array of optical elements can be less than the number of pixels in the array of pixels such that each optical element is aligned with more than one corresponding pixel. For example, a lenticular optical element can be aligned with a row of pixels.

Although display device 100 shown in FIG. 1 is described as comprising image display unit 130, other embodiments are included in this disclosure. In some embodiments, the light unit comprises a plurality of pixels each comprising an OLED or a plasma cell. Thus, the light unit comprises display pixels that emit light to generate the viewable image. In such embodiments, the light unit is configured as an integrated light unit and image display unit, and the separate image display unit (e.g., image display unit 130 shown in FIG. 1) can be omitted. In some of such embodiments, the light unit and the contrast enhancement unit are arranged such that an optical element focuses an image pixel generated by the light unit on a corresponding aperture of the contrast enhancement unit. For example, a plurality of image pixels emitted by the light unit is focused by the array of optical elements on the array of apertures so that the image pixels pass through the apertures in the light absorbing layer to transmit the viewable image through the light absorbing layer for viewing by the viewer.

Ambient light (e.g., from the sun, room lighting, or another light source) can fall on contrast enhancement unit 140 from the viewing side. In other words, ambient light from outside display device 100 can fall on second major surface 144 of contrast enhancement unit 140. Light absorbing layer 148 absorbs at least a portion of such ambient light that falls on the light absorbing layer outside of apertures 150. Such absorption of ambient light can increase the contrast of display device 100 (e.g., because the absorbed ambient light does not interfere with the light emitted from the contrast enhancement unit as a viewable image). Accordingly, it can be beneficial for the area occupied by apertures 150 to be relatively small. In some embodiments, apertures 150 occupy at most about 50%, at most about 40%, at most about 30%, at most about 20%, at most about 10%, at most about 5%, or at most about 1% of a surface area of light absorbing layer 148. Thus, most of the surface area of light absorbing layer 148 is occupied by light absorbing material to absorb ambient light and increase the contrast of display device 100.

In the embodiment shown in FIG. 1, contrast enhancement unit 140 comprises a substrate 152. For example, substrate 152 comprises a glass substrate. Such a glass substrate can enable improved dimensional stability (e.g., reduced deformation resulting from changes in environmental conditions such as temperature and/or humidity) as compared to a polymer substrate. Such improved dimensional stability can aid in maintaining alignment between the array of display pixels and the array of optical elements at varying environmental conditions, which can help to prevent, for example, Moire patterns, even in embodiments in which the pixel pitch of the image display unit and the pitch of the optical elements are not equal. In other embodiments, substrate 152 comprises a polymer material or another suitable substrate material. A resin layer 154 is disposed on a surface of substrate 152, and the array of optical elements 146 is formed in the resin layer. For example, the array of optical elements 146 can be formed using a microreplication process, an embossing process, or another suitable forming process. In other embodiments, the array of optical elements is formed directly in the substrate. For example, the array of optical elements can be formed by machining the surface of the substrate. In some embodiments, light absorbing layer 148 comprises a resin layer disposed on a surface of substrate 152 opposite the array of optical elements 146. The resin of light absorbing layer 148 comprises a resin material having a high optical density (e.g., a black matrix resin). In some embodiments, substrate 152 comprises a glass substrate having a thickness of at most about 300 µm, at most about 250 µm, at most about 150 µm, or at most about 120 µm. Such a thin glass substrate can enable a reduced thickness of the display device without sacrificing dimensional stability.

In some embodiments, the substrate comprises a plurality of substrates. For example, the substrate comprises a first substrate with optical elements disposed on a surface thereof and a second substrate with the light absorbing layer disposed on a surface thereof. The first and second substrates can be positioned adjacent to each other to form the contrast enhancement unit comprising the substrate with optical elements and the light absorbing layer disposed on opposing surfaces thereof.

Figure 4:
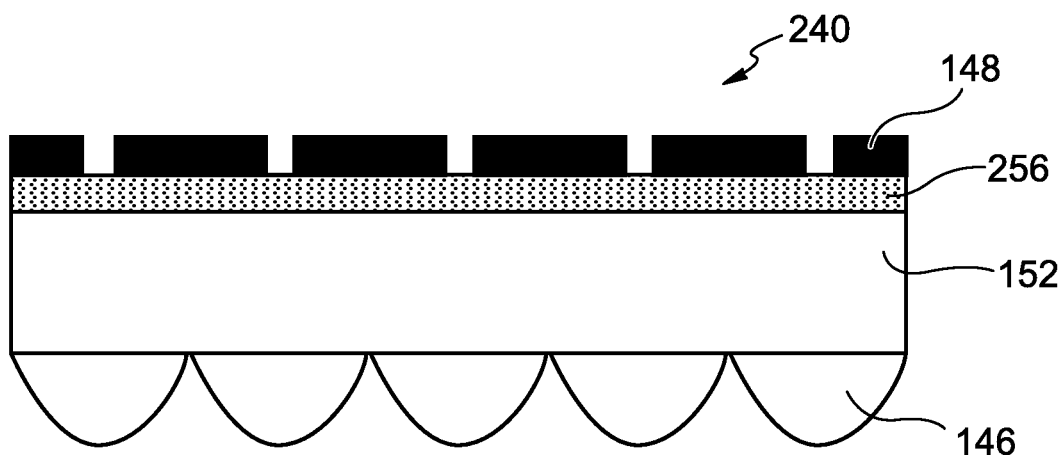
FIG. 4 is a schematic view of an exemplary embodiment of a contrast enhancement unit.
Figure 5:
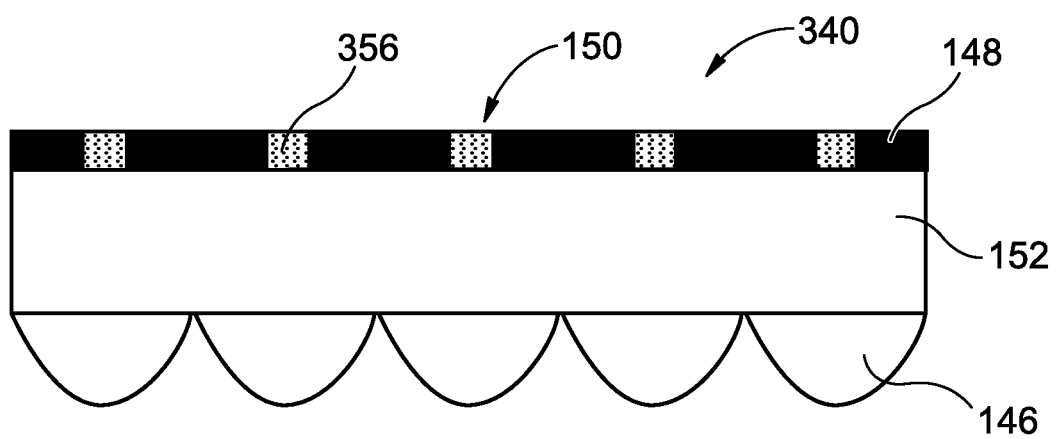
FIG. 5 is a schematic view of another exemplary embodiment of a contrast enhancement unit.

In some embodiments, the contrast enhancement unit comprises a diffusing element. The diffusing element is configured to scatter light that passes therethrough to increase the diffusion angle of the light. For example, the diffusing element can comprise a light scattering material. FIG. 4 is a schematic view of an exemplary embodiment of a contrast enhancement unit 240, which is similar to contrast enhancement unit 140 described herein with reference to FIG. 1. In the embodiment shown in FIG. 4, contrast enhancement unit 240 comprises a diffusing element 256 disposed between optical elements 146 and light absorbing layer 148. For example, diffusing element 256 is configured as a diffusing layer disposed between substrate 152 and light absorbing layer 148 as shown in FIG. 4. FIG. 5 is a schematic view of an exemplary embodiment of a contrast enhancement unit 340, which is similar to contrast enhancement unit 140 described herein with reference to FIG. 1. In the embodiment shown in FIG. 5, contrast enhancement unit 340 comprises a diffusing element 356 disposed within one or more apertures 150 in light absorbing layer 148. For example, one or more apertures 150 can be filled with diffusing material to form diffusing element 356 within the apertures. In some embodiments, diffusing element 356 is disposed within each aperture 150 as shown in FIG. 5. The diffusing element can help to increase the viewing angle of the display device.

In some embodiments, the diffusing element is integral with the substrate of the contrast enhancement unit. For example, a surface of the substrate (e.g., the surface upon which the optical elements are formed and/or the surface upon which the light absorbing layer is formed) comprises a roughened surface that diffuses light passing therethrough. Thus, the diffusing element comprises the roughened surface of the substrate.

In some embodiments, display device 100 comprises a transparent cover 160. Transparent cover 160 comprises a glass substrate (e.g., a soda lime glass, an alkali aluminosilicate glass, and/or an alkali aluminoborosilicate glass), a polymer substrate (e.g., polycarbonate), or another suitable substrate. Transparent cover 160 is disposed on an outer surface of display device 100. Transparent cover 160 can comprise a planar (e.g., a flat sheet) or a non-planar (e.g., a curved sheet) configuration. In some embodiments, transparent cover 160 comprises an anti-glare (AG) and/or an anti-reflective (AR) coating on an outer surface of the transparent cover. Transparent cover 160 can comprise a strengthened (e.g., thermally strengthened, mechanically strengthened, and/or chemically strengthened) glass, which can aid in protecting the other components of display device 100 from scratching and/or breakage.

Figure 6:
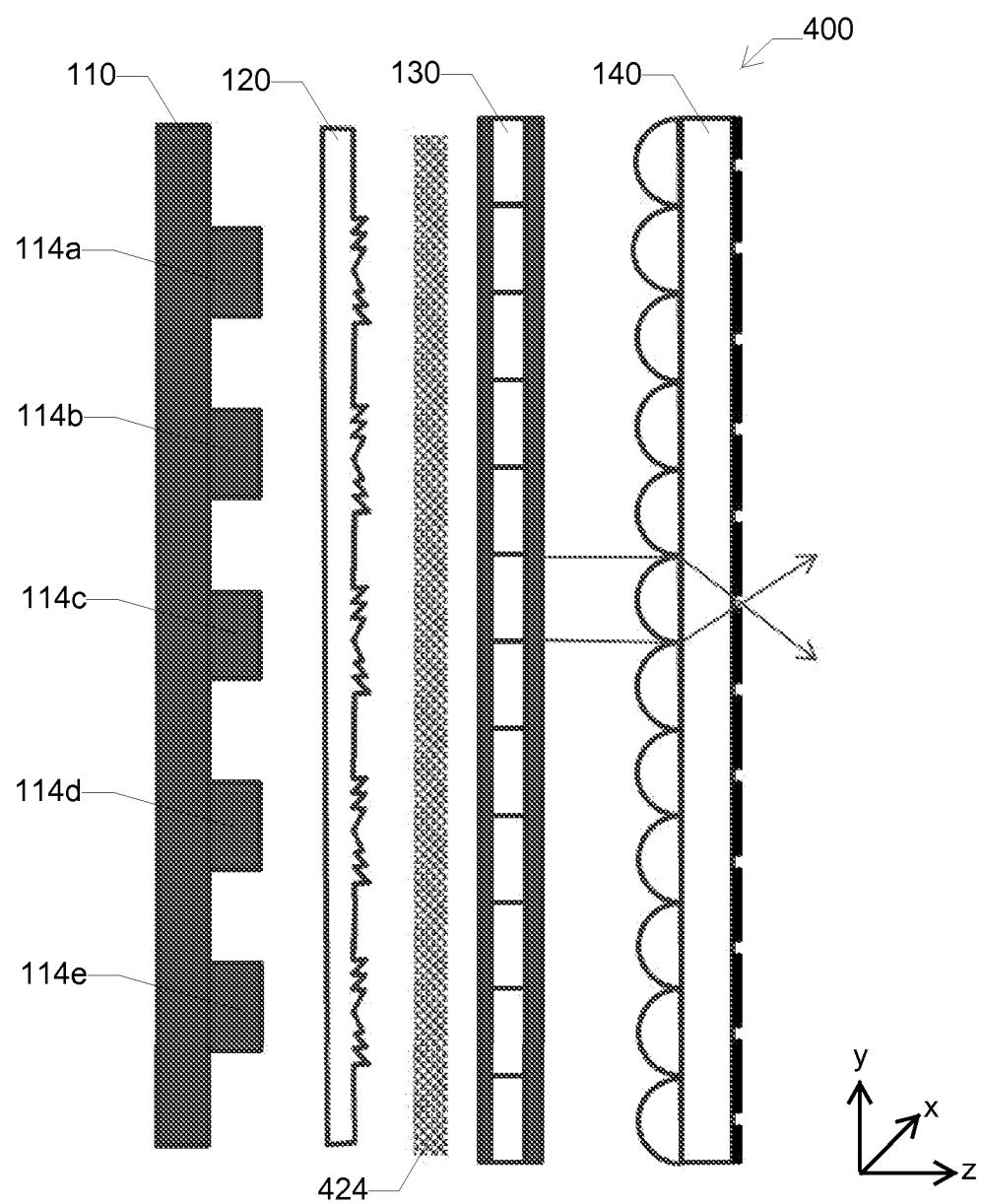
FIG. 6 is a schematic view of another exemplary embodiment of a display device.

FIG. 6 is a schematic view of an exemplary display device 400. Display device 400 is similar to display device 100 described in reference to FIG. 1. For example, Display device 400 comprises a light unit, image display unit 130, and contrast enhancement unit 140. The light unit comprises light emitting unit 110 and collimating unit 120. In the embodiment shown in FIG. 6, the light unit comprises a diffusing unit 424.

In some embodiments, light emitting unit 110 comprises a series 114*a* of light sources. Series 114*a* of light sources is arranged in a row extending in a first direction. For example, the first direction is shown in FIG. 6 as the x direction extending into the drawing. In some embodiments, the row is substantially linear as shown in FIG. 6. In other embodiments, the row is curved (e.g., for use in a curved display device). In some embodiments, series 114*a* of light sources is configured as a light bar comprising a plurality of LEDs or OLEDs.

Collimating unit 120 is disposed adjacent to series 114*a* of light sources. For example, collimating unit 120 extends substantially parallel to the row. Collimating unit 120 is configured to collimate the light emitted by series 114*a* of light sources in a second direction substantially perpendicular to the row without substantially collimating or collimating the light in the first direction substantially parallel to the row. The collimated light comprises a divergence angle of less than 10 degrees in the direction or directions in which the light is collimated. For example, the second direction is shown in FIG. 6 as the y direction. Collimating unit 120 comprises a collimating lens aligned with series 114*a* of light sources. For example, the collimating lens comprises a cylindrical lens, a cylindrical Fresnel lens, another suitable lens, or a combination thereof. In some embodiments, collimating unit 120 is spaced from series 114*a* of light sources by a distance that is substantially equal or equal to a focal length of the collimating unit. For example, the distance between a top surface of each individual light source of series 114*a* and collimating unit 120 (e.g., in the z direction) is substantially equal to the focal length of the collimating unit.

Figure 7:
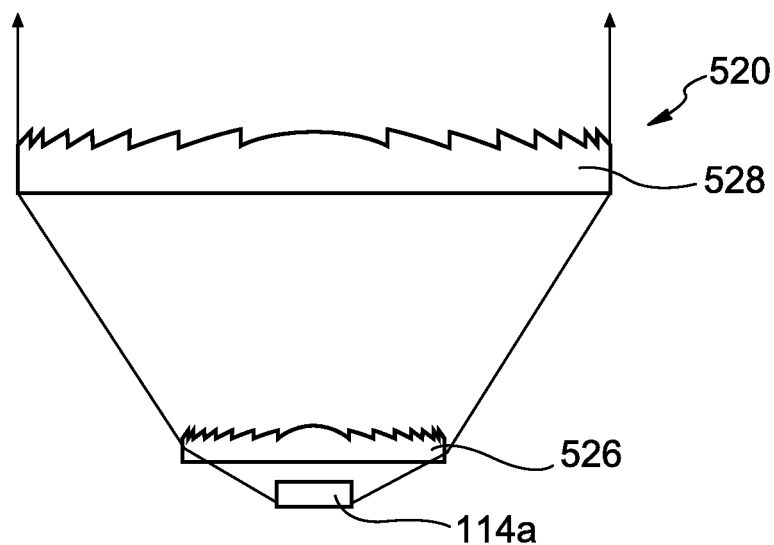
FIG. 7 is a schematic view of one exemplary embodiment of a collimating unit.

In the embodiment shown in FIG. 6, collimating unit 120 comprises a cylindrical Fresnel lens. FIG. 7 is a schematic view of another exemplary embodiment of a collimating unit 520. Collimating unit 520 comprises a conditioning element 526 and a collimating element 528. Collimating unit 520 is arranged such that conditioning element 526 is disposed between series 114*a* of light sources and collimating element 528. In some embodiments, the light emitted by series 114*a* of light sources comprises wide-angle light having a substantially Lambertian angular intensity distribution in the second direction. In some embodiments, in the Lambertian angular intensity distribution, light power traveling in different directions is not uniform, but rather is proportional to the cosine of an angle to a surface (e.g., a light source surface) normal. Conditioning element 526 is configured to transform the wide-angle light into uniform light having a substantially uniform angular intensity distribution in the second direction at a reference plane spaced from the conditioning element. It can be beneficial to position the collimating element at the reference plane such that the collimating element is substantially uniformly illuminated by the uniform light. For example, conditioning element 526 comprises a cylindrical lens, a Fresnel lens (e.g., a cylindrical Fresnel lens), another suitable lens, or a combination thereof. Collimating element 528 is configured to collimate the uniform light in the second direction. For example, collimating unit 528 comprises a cylindrical lens, a Fresnel lens (e.g., a cylindrical Fresnel lens), another suitable lens, or a combination thereof. The conditioning element can help to illuminate the collimating element uniformly across a surface of the collimating element, which can help to reduce the potential for brightness non-uniformity in the image generated by the display device that may be caused by the Lambertian output of the series of light sources.

Figure 8:
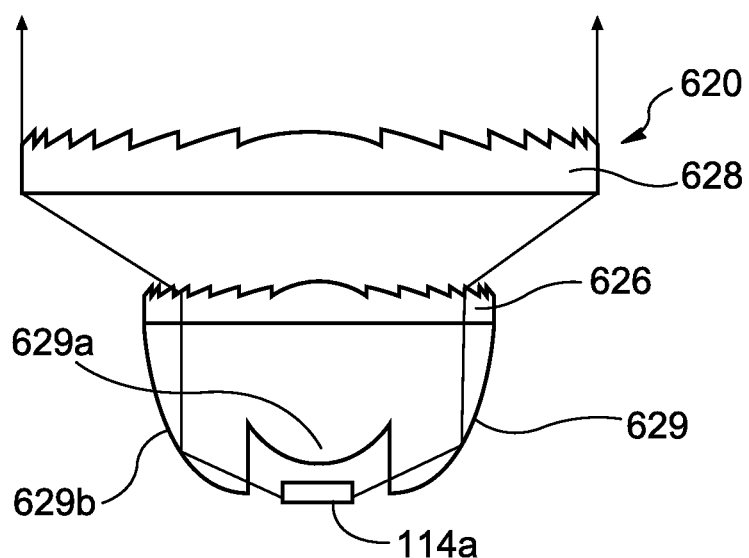
FIG. 8 is a schematic view of another exemplary embodiment of a collimating unit.

FIG. 8 is a schematic view of another exemplary embodiment of a collimating unit 620. Collimating unit 620 comprises a conditioning element 626, a collimating element 628, and a concentrating element 629. Collimating unit 620 is arranged such that conditioning element 626 is disposed between series 114*a* of light sources and collimating element 628, and concentrating element 629 is disposed between the series of light sources and the conditioning element. Concentrating element 629 is configured to concentrate the Lambertian light emitted by the series 114*a* of light sources onto conditioning element 626. For example, concentrating element 629 comprises a refractive portion 629*a* and a reflective portion 629*b*. In some embodiments, refractive portion 629*a* comprises a lens portion to direct light toward conditioning element 629. Additionally, or alternatively, reflective portion 629*b* comprises a mirror surface to direct light toward conditioning element 629. In some embodiments, concentrating element 629 comprises a molded refractive/reflective type collimator. Conditioning element 626 is configured to transform the Lambertian light emitted by series 114*a* of light sources into uniform light having a substantially uniform intensity distribution in the second direction. For example, conditioning element 626 comprises a cylindrical lens, a Fresnel lens (e.g., a cylindrical Fresnel lens), another suitable lens, or a combination thereof. Collimating element 628 is configured to collimate the uniform light in the second direction. For example, collimating unit 628 comprises a cylindrical lens, a Fresnel lens (e.g., a cylindrical Fresnel lens), another suitable lens, or a combination thereof. The concentrating element can help to collect a relatively large portion of the light emitted by the series of light sources and direct the light to the conditioning element. For example, in some embodiments, the concentrating element is configured to collect and/or at least partially collimate up to about 80% of the light emitted by the series of light sources. The conditioning element can help to illuminate the collimating element uniformly across a surface of the collimating element, which can help to reduce the potential for brightness non-uniformities in the image generated by the display device.

Although the collimating units shown in FIGS. 6-8 are described as 1-dimensional collimating units comprising, for example, cylindrical and/or cylindrical Fresnel lenses, other embodiments are included in this disclosure. For example, in other embodiments, the collimating unit is configured as a 2-dimensional collimating unit comprising a spherical and/or aspherical Fresnel lens. In various embodiments, the shape of the collimating unit may correspond to the shape of the optical elements of the contrast enhancement unit. For example, a 1-dimensional collimating unit may be used with a contrast enhancement unit comprising lenticular lenses. Additionally, or alternatively, a 2-dimensional collimating unit may be used with a contrast enhancement sheet comprising spherical and/or aspherical lenses.

Diffusing unit 424 is disposed adjacent to series 114*a* of light sources as shown in FIG. 6. For example, diffusing unit 424 is configured to diffuse the light emitted by the series of light sources in the first direction substantially parallel to the row (e.g., the x direction) without substantially diffusing or diffusing the light in the second direction substantially perpendicular to the row (e.g., the y direction). Thus, diffusing unit 424 comprises a 1-dimensional diffuser. In some embodiments, the diffusing unit comprises a plurality of small refractive or reflective elements, each of which deflects a light beam by a random angle between zero and a determined diffusion angle. If such angles are parallel to only one axis, then the diffusing unit functions as a 1-dimensional diffuser. If such angles form a cone or a portion of a cone with some angles along one axis and some angles along another perpendicular axis, then the diffusing unit functions as a 2-dimensional diffuser. The diffusing unit can help to homogenize the illumination of the display device. For example, the diffuser can be engineered to leave the light collimated in one direction, but diffuse the light in the other direction, such that a viewer of the display device will not see bright lines (corresponding to the individual light source positions) separated by dark spaces.

Diffusing unit 424 is disposed between light emitting unit 110 and contrast enhancement unit 140. For example, diffusing unit 424 is disposed between collimating unit 120 and contrast enhancement unit 140 and/or between the collimating unit and image display device 130. In some embodiments, collimating unit 120 is disposed between light emitting unit 110 and diffusing unit 424 as shown in FIG. 6. Such a configuration can aid in properly spacing the diffusing unit from the light emitting unit without unnecessarily increasing the thickness of the display device.

In some embodiments, diffusing unit 424 extends substantially parallel to series 114*a* of light sources and is spaced from the series of light sources. For example, series 114*a* of light sources comprises a first light source and a second light source disposed directly adjacent to the first light source and spaced from the first light source by a distance X (e.g., in the x direction). Diffusing unit 424 is spaced from series 114*a* of light sources by a distance Z (e.g., in the z direction). For the diffusing unit to be efficient in achieving brightness uniformity, the diffusion angle should be greater than the angular size of the gap between individual light sources, visible from the diffuser position. For example, diffusing unit 424 comprises a diffusion angle $\theta$ that satisfies the formula: $\theta > \arctan(X/Z)$.

Although the diffusing unit shown in FIG. 6 is described as 1-dimensional diffusing unit that diffuses light in one direction, other embodiments are included in this disclosure. For example, in other embodiments, the diffusing unit is configured as a 2-dimensional diffusing unit configured to diffuse light in two perpendicular directions. In various embodiments, the shape of the diffusing unit may correspond to the shape of the optical elements of the contrast enhancement unit and/or the shape of the collimating unit. For example, a 1-dimensional diffusing unit may be used with a contrast enhancement unit comprising lenticular lenses and/or with a 1-dimensional collimating unit. Additionally, or alternatively, a 2-dimensional diffusing unit may be used with a contrast enhancement sheet comprising spherical and/or aspherical lenses and/or with a 2-dimensional collimating unit.

In some embodiments, display device 400 comprises multiple series of light sources. For example, in the embodiment shown in FIG. 6, display device 400 comprises a second series 114*b* of light sources directly adjacent to series 114*a*. Second series 114*b* of light sources is arranged in a second row. The second row of second series 114*b* is spaced from the row of series 114*a*. In some embodiments, the second row of second series 114*b* is substantially parallel to the row of series 114*a*. Thus, the second row of second series 114*b* extends in the first direction. Individual light sources of series 114*a* and/or second series 114*b* are spaced from one another such that the light sources are dispersed (e.g., evenly dispersed) along the length and/or width of display device 130. In some embodiments, series 114*a* and second series 114*b* comprise the same number of individual light sources. In the embodiment shown in FIG. 6, display device 400 comprises a third series 114*c* of light sources directly adjacent to second series 114*b*, a fourth series 114*d* of light sources directly adjacent to third series 114*c*, and a fifth series 114*e* of light sources directly adjacent to fourth series 114*d*. Each series of light sources is arranged in a row. In some embodiments, the rows are substantially parallel to one another. Additionally, or alternatively, the spacing between directly adjacent rows is substantially constant.

In some embodiments, display device 400 comprises multiple collimating units. For example, in the embodiment shown in FIG. 6, display device 400 comprises a collimating unit disposed adjacent to each series of light sources. Thus, the light emitted by each series of light sources is collimated and/or diffused by the corresponding collimating unit as described herein with reference to series 114*b* of light sources and collimating unit 120. In some embodiments, multiple collimating units are adjacent portions of a unitary collimating sheet as shown in FIG. 6. Such a unitary collimating sheet can be formed using a microreplication process, an embossing process, or another suitable forming process.

In some embodiments, diffusing unit 424 comprises a diffusing sheet as shown in FIG. 6. Such a diffusing sheet can be disposed adjacent to multiple series of light sources to diffuse the light emitted by each of the multiple series of light sources as described herein.

Although display device 400 is described as comprising five series of light sources arranged in five rows, other embodiments are included in this disclosure. In other embodiments, the display device comprises a determined number (e.g., one, two, three, four, six, or more) series of light sources arranged in rows. Each series of light sources comprises a determined number (e.g., two, three, four, or more) of individual light sources. In some embodiments, the focal length of the optical elements of the contrast enhancement unit divided by the focal length of the collimating unit, is equal or approximately equal to the size of the apertures of the contrast enhancement unit divided by the size of the light sources of the light unit. Such a relationship can be used to determine the number and/or placement of light sources.

In some embodiments, the light unit comprises end walls disposed at either end of the series of light sources. For example, the end walls extend substantially perpendicular to the series of light sources at each end thereof. In some embodiments, the end walls comprise reflective interior surfaces (e.g., facing inward into the display device). Such reflective interior surfaces can reflect light into the display device to avoid areas of reduced brightness at the edges of the display device.

Although both 1-dimensional and 2-dimensional designs are described herein, the 1-dimensional design may be advantageous in some applications. For example, the 1-dimensional design may be relatively less complex to manufacture (e.g., as a result of simpler optics and/or less stringent alignment tolerances between various components of the display device). Additionally, or alternatively, the 1-dimensional diffusing unit can enable "scrambling" of the optical phase of the incoming light, which can help to prevent interference that could otherwise create strong spatial non-uniformities after light is passed through a set of equidistant apertures.

Figure 9:
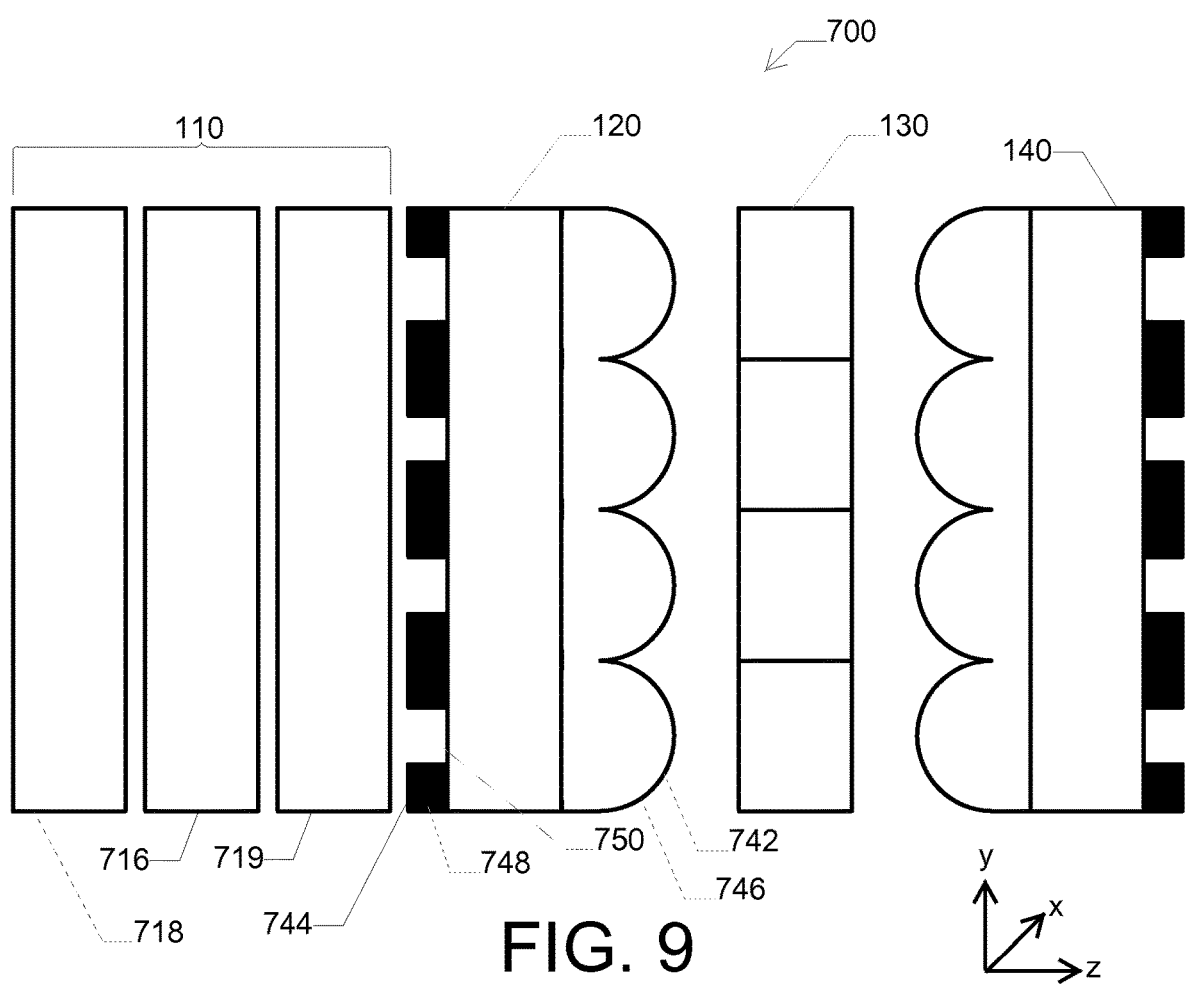
FIG. 9 is a schematic view of another exemplary embodiment of a display device.

FIG. 9 is a schematic view of an exemplary display device 700. Display device 700 is similar to display device 100 described in reference to FIG. 1 and display device 400 described in reference to FIG. 6. For example, display device 700 comprises a light unit, image display unit 130, and contrast enhancement unit 140. The light unit comprises light emitting unit 110 and collimating unit 120.

In some embodiments, light emitting unit 110 comprises one or more light sources. For example, in the embodiment shown in FIG. 9, light emitting unit 110 comprises a light guide 716 and one or more light sources positioned to inject light into an edge of the light guide. In some embodiments, light guide 716 is configured as a light guiding sheet. Light guide 716 is configured to guide the light injected into the edge and emit the light from at least one surface of the light guide. Light guide 716 comprises a glass substrate, a polymer substrate, an air gap, or another suitable light guiding apparatus. In some embodiments, the one or more light sources is configured as a light bar comprising a plurality of LEDs or OLEDs disposed adjacent to an edge of the light guide.

In some embodiments, light emitting unit 110 comprises a reflective diffusing unit 718. Reflective diffusing unit 718 is configured to reflect and diffuse light at one surface of light guide 716 and direct the reflected and diffused light toward an opposite surface of the light guide. For example, in the embodiment shown in FIG. 9, reflective diffusing unit 718 comprises a substrate disposed adjacent to a first surface of light guide 716 to reflect and diffuse light emitted from the first surface and direct the reflected and diffused light into the light guide and toward a second surface opposite the first surface. In other embodiments, the first surface of the light guide can serve as the reflective diffusing unit. For example, a coating and/or surface treatment (e.g., surface roughening) can be applied to the first surface of the light guide to serve as the reflective diffusing unit. In some embodiments, the first surface of the light guide is coated with a reflective coating (e.g., a white or mirrored coating) and/or roughened to serve as the reflective diffusing unit. The reflective diffusing unit can help to increase the amount of light directed toward the second surface of the light guide to be emitted to generate an image for viewing by a viewer.

In some embodiments, light emitting unit 110 comprises a brightness enhancing unit 719. Brightness enhancing unit 719 is configured to collect light at one surface of light guide 716 and direct the light away from the light guide. For example, in the embodiment shown in FIG. 9, brightness enhancing unit 719 comprises a brightness enhancing film disposed adjacent to the second surface of light guide 716. Thus, light guide 716 is disposed between reflective diffusing unit 718 and brightness enhancing unit 719. Brightness enhancing unit 719 comprises a brightness enhancing film (BEF) a double brightness enhancing film (DBEF), or another suitable brightness enhancing structure.

Collimating unit 120 is disposed adjacent to light emitting unit 110. Collimating unit 120 is configured to collimate the light emitted by light emitting unit 110 in at least one direction. In the embodiment shown in FIG. 9, collimating unit 120 is similar to contrast enhancement unit 140, but modified as described below. For example, collimating unit 120 comprises a first major surface 742 and a second major surface 744 opposite the first major surface. First major surface 742 comprises an array of optical elements 746. Array of optical elements 746 can be configured as described herein with respect to the array of optical elements 146. In some embodiments, array of optical elements 746 comprises an array of collimating lenses (e.g., cylindrical lenses, Fresnel lenses, cylindrical Fresnel lenses, or combinations thereof). Second major surface 744 comprises a light reflecting layer 748 and an array of apertures 750 in the light reflecting layer. Light reflecting layer 748 comprises a reflective material (e.g., a white or mirrored layer). Array of apertures 750 can be configured as described herein with respect to array of apertures 150. Array of apertures 750 corresponds to the array of optical elements 746. For example, each optical element 746 is aligned with at least one aperture 750. Collimating unit 120 is reversed compared to contrast enhancement unit 140. For example, collimating unit 120 is disposed adjacent to light emitting unit 110 such that light emitted from the light emitting unit is incident on second surface 148 of the collimating unit. Thus, second surface 148 comprises an inlet surface, and first surface 744 comprises an outlet surface. Collimating unit 120 and light emitting unit 110 are arranged such that light reflecting layer 748 is disposed between the light emitting unit and array of optical elements 746.

In the embodiment shown in FIG. 9, the array of apertures comprises an array of elongate apertures extending in the first direction, and array of optical elements 746 comprises an array of lenticular lenses extending in the first direction. Thus, the first direction is aligned with the length of the elongate apertures and/or the longitudinal axis of the lenticular lenses. Light emitted from the second surface of light guide 716 contacts second surface 744 of collimating unit 120. Light that contacts second surface 744 at an aperture of light reflecting layer 748 passes through the light reflecting layer to be focused by an optical element and directed toward image display unit 130 and/or contrast enhancement unit 140. The remaining light that contacts second surface 744 is reflected by light reflecting layer 748 into light guide 716. Thus, light can be recycled into light guide 716 until allowed through an aperture of collimating unit 120. Collimating unit 120 is configured to collimate the light emitted from light guide 716 (e.g., by forcing the light through relatively narrow apertures). Additionally, or alternatively, brightness enhancing unit 719 can help to ensure that only the proper polarization passes through the apertures. Collimating unit 120 with elongate apertures and lenticular lenses as described herein is configured to collimate the light in the second direction (e.g., perpendicular to the apertures and lenticular lenses) without collimating the light in the first direction (e.g., parallel to the apertures and lenticular lenses). Thus, collimating unit 120 can be configured as a 1-dimensional collimating unit. Because light emitting unit 110 shown in FIG. 9 comprises reflective diffusing unit 718, the light emitted by collimating unit 120 can be diffused in the first direction without using an additional diffusing unit.

Although array of optical elements 146 and array of optical elements 746 are shown in FIG. 9 as having the same pitch, other embodiments are included in this disclosure. In other embodiments, the arrays of optical elements can have the same or different pitches, the same or different shapes, and the same or different sizes. Although array of apertures 150 and array of apertures 750 are shown in FIG. 9 as having the same pitch, other embodiments are included in this disclosure. In other embodiments, the arrays of apertures can have the same or different pitches, the same or different shapes, and the same or different sizes.

Various components of the different embodiments described herein can be used in combination with one another. For example, collimating unit 120 shown in FIG. 9 can be used with light unit 110 shown in FIG. 6. Additionally, or alternatively, collimating unit 120 shown in FIG. 6 can be used with light unit 110 shown in FIG. 9. Additionally, or alternatively, contrast enhancement unit 240 shown in FIG. 4 or contrast enhancement unit 340 shown in FIG. 5 can be used with collimating unit 120 shown in FIG. 6 or collimating unit 120 shown in FIG. 9 and light unit 110 shown in FIG. 6 or light unit 110 shown in FIG. 9.

In some embodiments, a method for generating an image viewable directly by a viewer comprises emitting light, collimating the light in a second direction without collimating the light in a first direction perpendicular to the second direction, and diffusing the light in the first direction without diffusing the light in the second direction. In some embodiments, the emitting light comprises emitting Lambertian light having a substantially Lambertian intensity distribution in the second direction, and the method further comprises transforming the Lambertian light into uniform light having a substantially uniform intensity distribution in the second direction prior to the collimating the light in the second direction. In some embodiments, the method further comprises focusing the light onto an array of apertures of a light absorbing layer for viewing directly by the viewer.

It will be apparent to those skilled in the art that various modifications and variations can be made without departing from the spirit or scope of the invention. Accordingly, the invention is not to be restricted except in light of the attached claims and their equivalents.

What is claimed is:

1. A direct view display device comprising:
   a light unit comprising:
      a first series of light sources arranged in a first row and configured to emit light, the first row extending parallel to a first direction;
      a first collimating unit configured to collimate the light in a second direction perpendicular to the first direction without substantially collimating the light in the first direction; and
      a diffusing unit configured to diffuse the light in the first direction parallel to the row without substantially diffusing the light in the second direction perpendicular to the row, wherein the first collimating unit is disposed between the diffusing unit and the first series of light sources; and
   an image display unit comprising an array of pixels, wherein the diffusing unit is disposed between the first collimating unit and the image display unit.

2. The direct view display device of claim 1, wherein the first series of light sources comprises a first light source and a second light source directly adjacent to the first light source and spaced from the first light source by a distance X, the diffusing unit is spaced from the first series of light sources by a distance Z, and the diffusing unit comprises a diffusion angle θ that satisfies the formula: θ>arctan(X/Z).

3. The direct view display device of claim 1, wherein the light emitted by the first series of light sources comprises wide-angle light having a substantially Lambertian angular intensity distribution in the second direction, and the first collimating unit comprises:
   a conditioning element to transform the wide-angle light into uniform light having a substantially uniform angular intensity distribution in the second direction at a reference plane spaced from the conditioning element; and
   a collimating element to collimate the uniform light in the second direction.

4. The direct view display device of claim 1, wherein the first collimating unit comprises at least one of a cylindrical lens or a cylindrical Fresnel lens.

5. The direct view display device of claim 1, wherein the first collimating unit is spaced from each of the first series of light sources by a distance that is approximately equal to a focal length of the first collimating unit.

6. The direct view display device of claim 1, further comprising:
   a second series of light sources arranged in a second row substantially parallel to the first row and configured to emit light;
   a second collimating unit disposed adjacent to the second series of light sources to collimate the light from the second series of light sources in the second direction without substantially collimating the light from the second series of light sources in the first direction.

7. The direct view display device of claim 6, wherein the first collimating unit and the second collimating unit are adjacent portions of a unitary collimating sheet.

8. The direct view display device of claim 1, further comprising:
   a contrast enhancement unit comprising a first major surface and a second major surface opposite the first major surface, the first major surface comprising an array of optical elements, the second major surface comprising a light absorbing layer and an array of apertures in the light absorbing layer and corresponding to the array of optical elements, the contrast enhancement unit and the image display unit arranged such that each optical element of the contrast enhancement unit is aligned with at least one corresponding pixel of the image display unit, and the contrast enhancement unit and the light unit arranged such that the array of optical elements is disposed between the light unit and the light absorbing layer.

9. The direct view display device of claim 8, wherein the array of optical elements comprises an array of lenticular lenses.

10. The direct view display device of claim 9, wherein the array of apertures comprises an array of substantially linear apertures, and each aperture is aligned with a corresponding lenticular lens.

11. A light unit for a direct view display device, the light unit comprising:
   a light source configured to emit wide-angle light having a substantially Lambertian angular intensity distribution;
   a conditioning element configured to transform the wide-angle light from the light source into uniform light having a substantially uniform angular intensity distribution at a reference plane spaced from the conditioning element;
   a collimating element configured to collimate the uniform light from the conditioning element in a second direction without substantially collimating the uniform light in a first direction perpendicular to the second direction; and
   a diffusing unit configured to diffuse the uniform light in the first direction without substantially diffusing the uniform light in the second direction.

12. The light unit of claim 11, further comprising a concentrating element disposed between the light source and the conditioning element to concentrate the Lambertian light onto the conditioning element.

13. A direct view display device comprising:
   the light unit of claim 11; and
   a contrast enhancement unit comprising a first major surface and a second major surface opposite the first major surface, the first major surface comprising an array of optical elements, the second major surface comprising a light absorbing layer and an array of apertures in the light absorbing layer and corresponding to the array of optical elements, the contrast enhancement unit and the light unit arranged such that the array of optical elements is disposed between the light unit and the light absorbing layer.

14. The light unit of claim 11, wherein the collimating unit comprises at least one of a cylindrical lens or a cylindrical Fresnel lens.

15. A direct view display device comprising:
   a series of light sources arranged in a row and configured to emit light;
   a collimating unit configured to collimate the light;
   a diffusing unit configured to diffuse the light, wherein the collimating unit is disposed between the diffusing unit and the series of light sources;
   an image display unit comprising an array of pixels, wherein the diffusing unit is disposed between the collimating unit and the image display unit; and
   a contrast enhancement unit comprising a first major surface and a second major surface opposite the first major surface, the first major surface comprising an array of optical elements, the second major surface comprising a light absorbing layer and an array of apertures in the light absorbing layer and corresponding to the array of optical elements, wherein the contrast enhancement unit and the image display unit are arranged such that each optical element of the contrast enhancement unit is aligned with at least one corresponding pixel of the image display unit, a number of the optical elements in the array of optical elements is the same as the number of pixels in the array of pixels, and the array of optical elements is disposed between the image display unit and the light absorbing layer.

16. The direct view display device of claim 15, wherein the contrast enhancement unit comprises a glass substrate.

17. The direct view display device of claim 16, wherein the contrast enhancement unit comprises a resin layer disposed on the glass substrate, and the array of optical elements is formed in the resin layer.

18. The direct view display device of claim 16, wherein the array of optical elements is formed directly in the glass substrate.

19. The direct view display device of claim 16, wherein the glass substrate is at most about 300 µm thick.

20. The direct view display device of claim 15, wherein the contrast enhancement unit comprises a diffusing element, and the diffusing element comprises at least one of:

a diffusing layer disposed between the array of optical elements and the light absorbing layer; or a diffusing material within the array of apertures in the light absorbing layer.

21. The direct view display device of any claim 15, wherein the apertures occupy at most about 50% of a surface area of the light absorbing layer.

22. The direct view display device of claim 15, wherein the collimating unit comprises a Fresnel lens.

23. The direct view display device of claim 15, further comprising a transparent cover, the contrast enhancement unit disposed between the image display unit and the transparent cover.

24. The direct view display device of claim 15, wherein the collimating unit comprises a cylindrical lens.

* * * * *

UNITED STATES PATENT AND TRADEMARK OFFICE
CERTIFICATE OF CORRECTION

Page 1 of 1

PATENT NO. : 10,838,255 B2
APPLICATION NO. : 15/516787
DATED : November 17, 2020
INVENTOR(S) : Kevin Thomas Gahagan et al.

It is certified that error appears in the above-identified patent and that said Letters Patent is hereby corrected as shown below:

In the Claims

In Column 17, Line 5, Claim 21, after "of" delete "any".

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*